(12) United States Patent
Wu et al.

(10) Patent No.: US 8,878,630 B2
(45) Date of Patent: Nov. 4, 2014

(54) COMMON-MODE NOISE SUPPRESSION FILTER

(75) Inventors: Tzong-Lin Wu, Taipei (TW); Chung-Hao Tsai, Taipei (TW)

(73) Assignee: National Taiwan University, Taipei (TW)

( * ) Notice: Subject to any disclaimer, the term of this patent is extended or adjusted under 35 U.S.C. 154(b) by 313 days.

(21) Appl. No.: 13/243,896

(22) Filed: Sep. 23, 2011

(65) Prior Publication Data

US 2013/0002378 A1    Jan. 3, 2013

(30) Foreign Application Priority Data

Jun. 29, 2011   (TW) ............................. 100122792 A

(51) Int. Cl.
*H04B 3/14* (2006.01)
*H03H 7/42* (2006.01)

(52) U.S. Cl.
CPC . *H04B 3/14* (2013.01); *H03H 7/427* (2013.01)
USPC ........................................................ 333/172

(58) Field of Classification Search
USPC ........................................................ 333/172
See application file for complete search history.

(56) References Cited

U.S. PATENT DOCUMENTS 8,081,675 B2 *  12/2011  Shakiba et al. ............... 375/229
2009/0295514 A1 *  12/2009  Lee ............................. 333/28 R

OTHER PUBLICATIONS

Chung-Hao Tsai, Tzong-Lin Wu, A Broadband and Miniaturized Common-Mode Filter for Gigahertz Differential Signals Based on Negative-Permittivity Metamaterials, Jan. 2010, IEEE Transactions on Microwave Theory and Techniques, vol. 58, pp. 195-202.*
Shu-Jung Wu, Chung-Hao Tsai, Tzong-Lin Wu, Tatsuo Itoh, A Novel Wideband Common-Mode Suppression Filter for Gigahertz Differential Signals Using Coupled Patterned Ground Structure, Apr. 2009, IEEE Transactions on Microwave Theory and Techniques, vol. 57, pp. 848-855.*

* cited by examiner

*Primary Examiner* — Stephen Jones
*Assistant Examiner* — Scott S Outten
(74) *Attorney, Agent, or Firm* — Tim Tingkang Xia, Esq.; Morris, Manning & Martin, LLP

(57) ABSTRACT

This invention provides a digital electronic device comprising: a grounded metal portion comprising a first metal plate electrically connected to ground and a first substrate disposed on the first metal plate; at least one layer of differential-mode reference metal portion comprising a second substrate and a second metal plate electrically connected to the first metal plate by at least one conductive structure; a pair of differential signal lines at least partially disposed on the second substrate of the at least one layer of differential-mode reference metal portion and electromagnetically coupled to the second metal plate of the at least one layer of differential-mode reference metal portion; and an equalizer electrically connected to the pair of differential signal lines.

9 Claims, 10 Drawing Sheets

106, 107

//COMMON-MODE NOISE SUPPRESSION FILTER

CROSS-REFERENCE TO RELATED APPLICATIONS

This non-provisional application claims priority under 35 U.S.C. §119(a) on Patent Application No. 100122792 filed in Taiwan, R.O.C. on Jun. 29, 2011, the entire contents of which are hereby incorporated by reference.

BACKGROUND OF THE INVENTION

1. Field of the Invention

The present invention relates to a digital electronic device, and more particularly, to a digital electronic device capable of suppressing common-mode noise.

2. Description of the Prior Art

With the increasing operation speed and clock frequency of high-speed digital circuits, differential microstrip lines and strip lines have been widely used for transmitting differential signals. Ideally, a differential transmission line is characterized by low crosstalk effect and lower electromagnetic radiation. However, discontinuous structures, such as bends, through holes, etc. of an electronic circuit configured to reduce the required area or asymmetric magnitude and phase of an outputted differential signal, may result in the common-mode noise. The common-mode noise will be transmitted via the ground plane to the edge of the plate, the connected leads and the shielding metal, causing serious problems concerning electromagnetic compatibility and electromagnetic interference. Moreover, the differential transmission line is not a perfect metal and thus has a limited conductivity, and there is a dissipative medium existing in the differential transmission line. Accordingly, frequency dependent transmission line loss occurs during the time when signals are transmitted, causing interbit interference. The interbit interference does great damage to the eye diagram (which represents signal quality), leading the logic circuit to make erroneous decisions.

Therefore, a digital electronic device capable of effectively suppressing common-mode noise and meanwhile improving the eye diagram needs to appear in the high-speed digital circuits.

SUMMARY OF THE INVENTION

An object of the present invention is to provide a digital electronic device capable of effectively suppressing common mode noise and improving eye diagram at the same time.

To achieve the aforementioned object, this invention provides a digital electronic device comprising: a grounded metal portion comprising a first metal plate electrically connected to ground and a first substrate disposed on the first metal plate; at least one layer of differential-mode reference metal portion comprising a second substrate and a second metal plate electrically connected to the first metal plate by at least one conductive structure; a pair of differential signal lines at least partially disposed on the second substrate of the at least one layer of differential-mode reference metal portion and electromagnetically coupled to the second metal plate of the at least one layer of differential-mode reference metal portion; and an equalizer electrically connected to the pair of differential signal lines.

In the aforementioned digital electronic device, the number of the at least one layer of differential-mode reference metal portion is one. Moreover, the layer of differential-mode reference metal portion is coplanar with the grounded metal portion, and the first metal plate and the second metal plate are separated from each other.

In the aforementioned digital electronic device, the equalizer is electromagnetically coupled to the second metal plate of the at least one layer of differential-mode reference metal portion.

In the aforementioned digital electronic device, part of the pair of differential signal lines is disposed on and electromagnetically coupled to the grounded metal portion.

In the aforementioned digital electronic device, the pair of differential signal lines are disposed symmetrically with respect to a centerline of the second metal plane.

In the aforementioned digital electronic device, the equalizer is a high-pass circuit with DC loss.

In the aforementioned digital electronic device, the equalizer is composed of two parallel RC circuits embedded respectively in the pair of differential signal lines.

In the aforementioned digital electronic device, the equalizer is a series resistor-inductor circuit bridging the pair of differential signal lines.

In the aforementioned digital electronic device, the equalizer bridges the pair of differential signal lines and comprises a resistor and a transmission line arranged in series connection.

In the aforementioned digital electronic device, the equalizer is composed of two parallel RC circuits and a series resistor-inductor circuit. The two parallel RC circuits are embedded respectively in the pair of differential signal lines and bridged by the series resistor-inductor circuit.

In the aforementioned digital electronic device, the equalizer is disposed symmetrically with respect to a centerline between the pair of differential signal lines.

In the aforementioned digital electronic device, the at least one via has a resistor.

In the present invention, the equalizer is embedded in or bridges a pair of differential signal lines so as to enhance the digital electronic device's capability to suppress common-mode noise and improve eye diagram.

DETAILED DESCRIPTION OF THE PREFERRED EMBODIMENTS

Figure 1A:
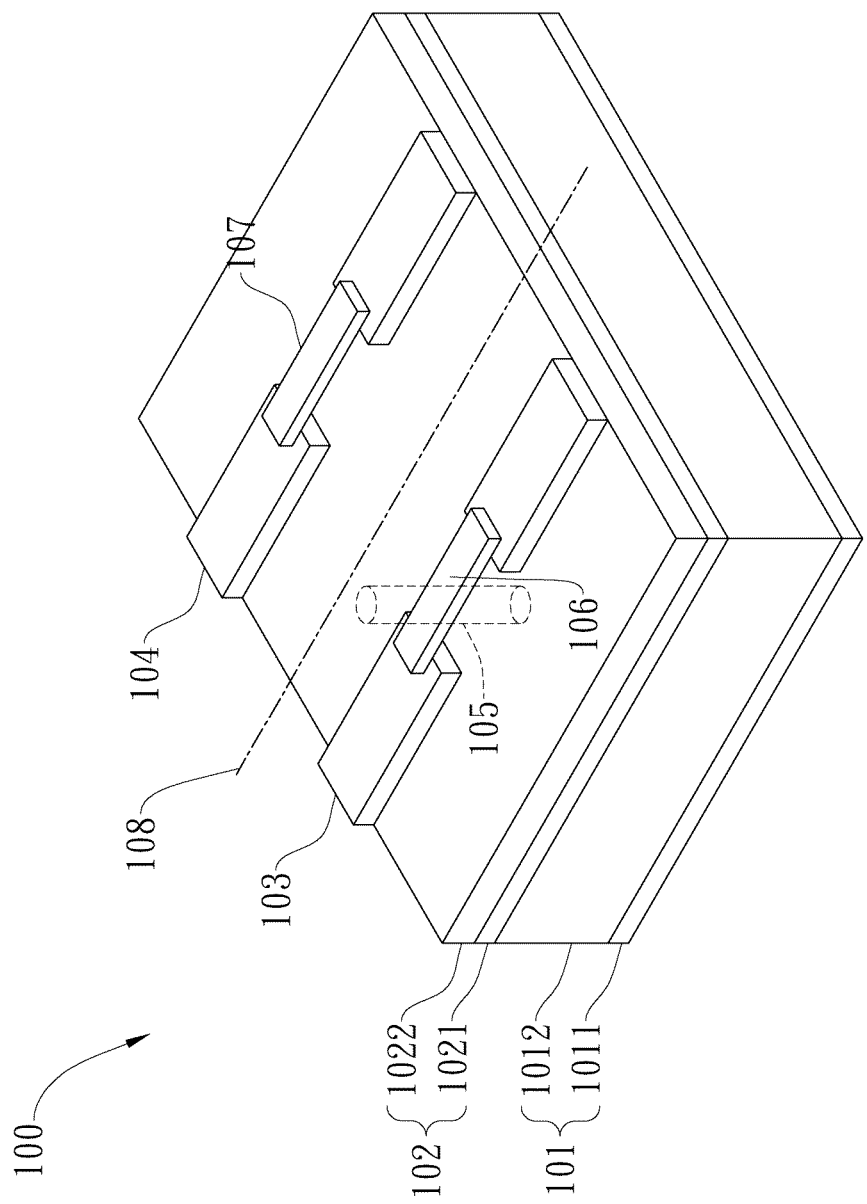
FIG. 1A is a perspective view of a digital electronic device in accordance with an embodiment of the present invention.

The present invention will be described more fully with the following exemplary embodiments. The present invention is not limited to the embodiments comprising specific features, structures or properties and the scope thereof is defined by the appended claims. Moreover, the drawings do not specifically depict all unessential features of the present invention. For the components illustrated in the drawings, they may be represented in simplified form or schematic manner. Furthermore, for the sake of clarity, the size of the illustrated components may be magnified or not in actual proportion. Whether or not the components are simplified in form or the features are illustrated in detail, they fall within the scope of knowledge of the art and can be implemented by those skilled in the art in view of other embodiments related to the features, structures or properties.

Figure 1B:
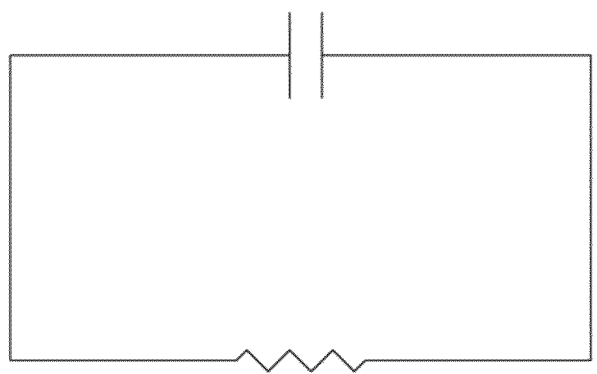
FIG. 1B is a circuit diagram of the equalizers shown in FIG. 1A.

FIG. 1A is a perspective view of a digital electronic device in accordance with an embodiment of the present invention. The digital electronic device 100 comprises a grounded metal portion 101 comprising a first metal plate 1011 electrically connected to ground and a first substrate 1012 disposed on the first metal plate 1011, a layer of differential-mode reference metal portion 102 comprising a second metal plate 1021 electrically connected to the first metal plate 1011 by a conductive structure 105 and a second substrate 1022 disposed on the second metal plate 1021, a pair of differential signal lines 103, 104 disposed on the second substrate 1022 and arranged symmetrically with respect to a centerline 108 of the second metal plate 1021, and equalizers 106, 107. FIG. 1B is a circuit diagram of the equalizers 106, 107 shown in FIG. 1A. The equalizers 106, 107 are two parallel RC circuits embedded respectively in the pair of differential signal lines 103, 104 to electrically connect to the pair of differential signal lines 103, 104. Further, the equalizers 106, 107 are disposed symmetrically with respect to the centerline 108 between the pair of differential signal lines 103, 104.

In the digital electronic device 100 of the present invention, the equalizers 106, 107 are electrically connected to the pair of differential signal lines 103, 104 so as to filter the common-mode noise and to improve the eye diagram during time when differential-mode signals are transmitted. Moreover, the equalizers 106, 107 of the present invention are disposed symmetrically with respect to the centerline 108 between the pair of differential signal lines 103, 104 so that no mode conversion happens and the center node of the equalizer is shorted to ground when the digital electronic device 100 is excited by the differential mode. Accordingly, the operation of the equalizers 106, 107 will not be affected and the eye diagram can be improved. When the digital electronic device 100 is activated under the common mode, the equalizers 106, 107 can suppress the common-mode noise.

Figure 2:
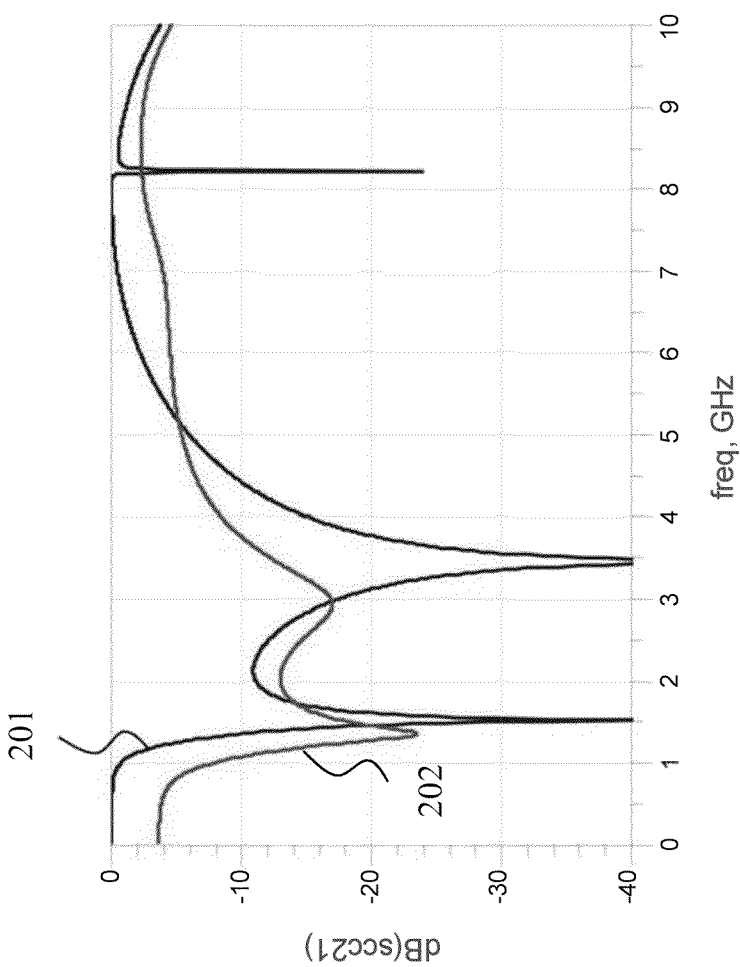
FIG. 2 is a simulation diagram showing the common-mode attenuation of the digital electronic device with equalizers shown in FIG. 1 and the common-mode attenuation of a digital electronic device without equalizers.
Figures 3A, 3B:
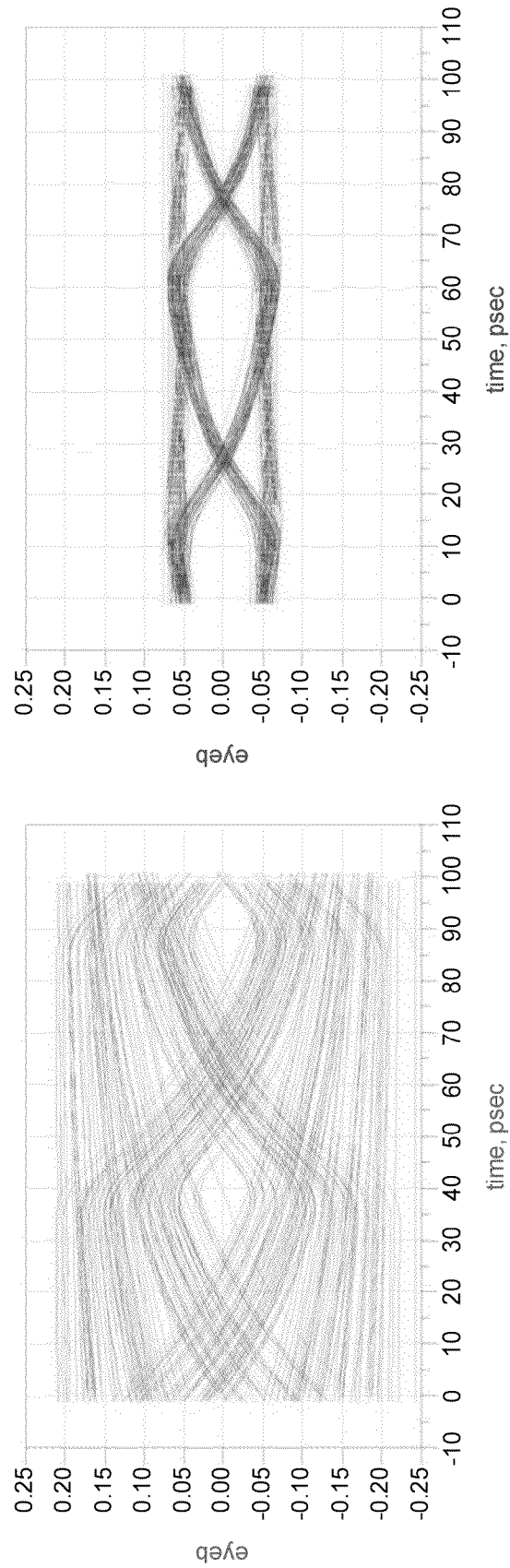
FIG. 3A is an eye diagram of a digital electronic device without equalizers.
FIG. 3B is an eye diagram of the digital electronic device with equalizers shown in FIG. 1.

FIG. 2 is a simulation diagram showing the common-mode attenuation of the digital electronic device with the equalizers 106, 107 shown in FIG. 1 and the common-mode attenuation of a digital electronic device without equalizers. The curve 202 represents the common-mode attenuation curve of the digital electronic device 100 with the equalizers 106, 107 while the curve 201 represents the common-mode attenuation curve of the digital electronic device without equalizers. As is clear from the comparison of the curves 201 and 202, the equalizers 106, 107 enable the digital electronic device 100 to have a better capability of suppressing direct current or low frequency common-mode noise rather than make interference with the performance of the common-mode noise suppression circuit. In another embodiment of the present invention, the conductive structure 105 has a resistor so that the digital electronic device 100 has a further enhanced capability of suppressing direct current or low frequency common-mode noise FIG. 3A is an eye diagram of a digital electronic device without equalizers, and FIG. 3B is an eye diagram of the digital electronic device 100 with the equalizers 106, 107 shown in FIG. 1. As is clear from the comparison of FIGS. 3A and 3B, the increment in eye height and eye width of the eye diagram of the digital electronic device 100 with the equalizers 106, 107 is significant. Therefore, the digital electronic device 100 with the equalizers 106, 107 is characterized by an improved eye diagram.

Figure 4:
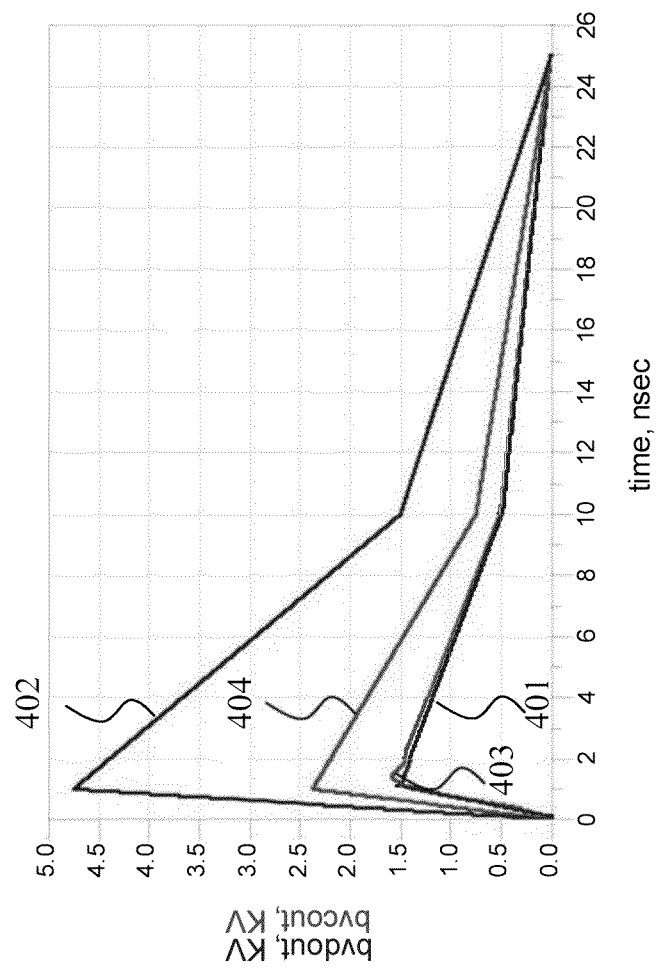
FIG. 4 is a diagram showing electrostatic discharge test results of the digital electronic device with equalizers shown in FIG. 1 and a digital electronic device without equalizers.

FIG. 4 is a diagram showing electrostatic discharge test results of the digital electronic device 100 with the equalizers 106, 107 shown in FIG. 1 and a digital electronic device without equalizers. The curve 401 represents the ESD (electrostatic discharge) surge curve of the digital electronic device 100 with the equalizers 106, 107 under the differential mode; the curve 402 represents the ESD surge curve of the digital electronic device without equalizers under the differential mode; the curve 403 represents the ESD surge curve of the digital electronic device 100 with the equalizers 106, 107 under the common mode; the curve 404 represents the ESD surge curve of the digital electronic device without equalizers under the common mode. As is clear from the comparison of the curves 401 and 402, the ESD surge of the digital electronic device 100 with the equalizers 106, 107 under the differential mode is apparently smaller than the ESD surge of the digital electronic device without equalizers under the differential mode. As is clear from the comparison of the curves 403 and 404, the ESD surge of the digital electronic device 100 with the equalizers 106, 107 under the common mode is apparently smaller than the ESD surge of the digital electronic device without equalizers under the common mode. Accordingly, the digital electronic device 100 with the equalizers 106, 107 has a better electrostatic protection capability under the differential mode as well as the common mode.

Figure 5A:
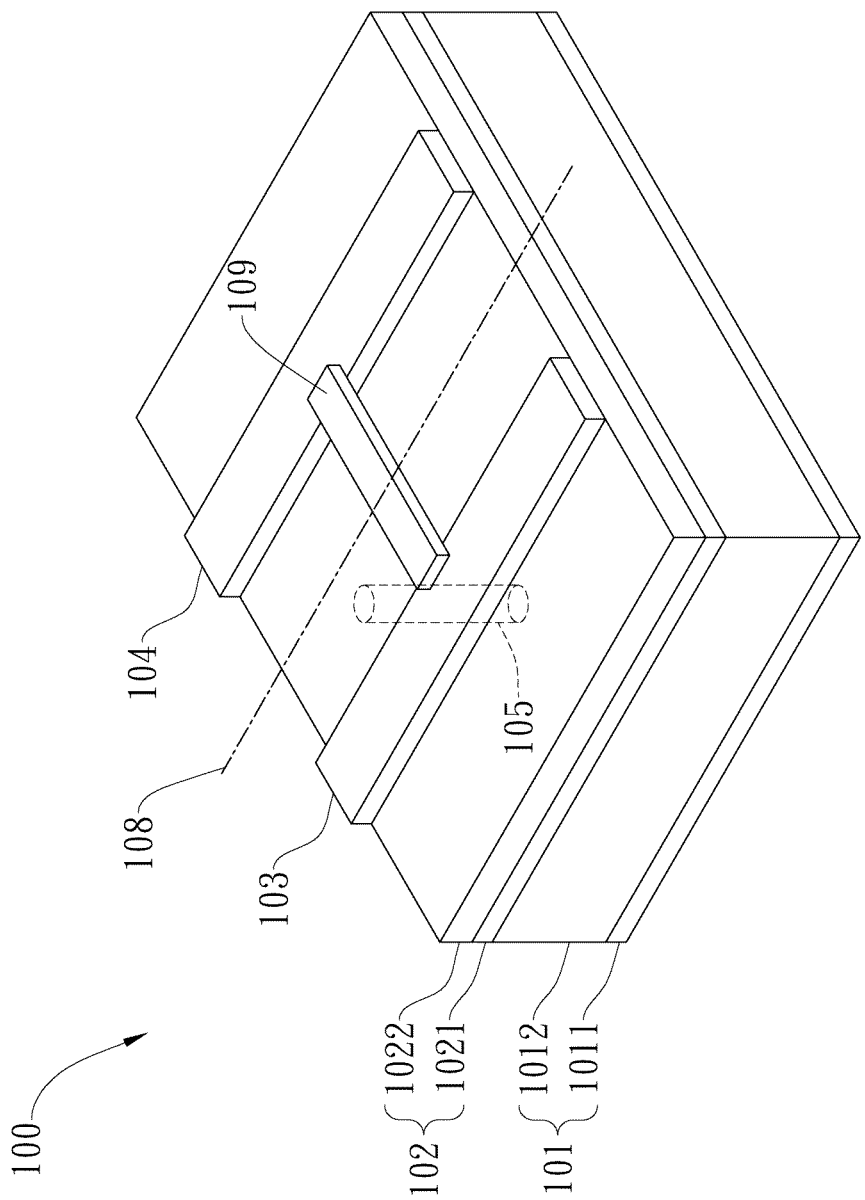
FIG. 5A is a perspective view of a digital electronic device in accordance with another embodiment of the present invention.
Figure 5B:
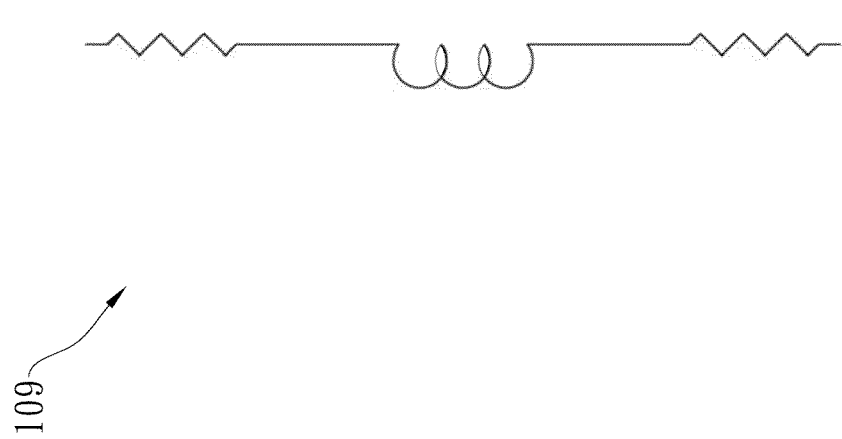
FIG. 5B is a circuit diagram of the equalizer shown in FIG. 5A.

FIG. 5A is a perspective view of a digital electronic device in accordance with another embodiment of the present invention, and FIG. 5B is a circuit diagram of the equalizer shown in FIG. 5A. In this embodiment, the equalizer may be a series resistor-inductor circuit 109 bridging the pair of differential signal lines 103, 104 to electrically connect to the pair of differential signal lines 103, 104. Moreover, the series resistor-inductor circuit 109 is disposed symmetrically with respect to the centerline 108 between the pair of differential signal lines 103, 104. In another embodiment of the present invention, the equalizer comprises a resistor and a transmission line arranged in series connection. The equalizer bridges the pair of differential signal lines 103, 104 to electrically connect to the pair of differential signal lines 103, 104 and is disposed symmetrically with respect to the centerline 108 between the pair of differential signal lines 103, 104. Further, the equalizer is electromagnetically coupled to the second metal plate 1021 of the layer of differential-mode reference metal portion 102 so that the digital electronic device 100 has a further enhanced capability of suppressing low frequency noise. That is, the curve 202 of FIG. 2 will be displaced further toward the left (low frequency).

Figure 6:
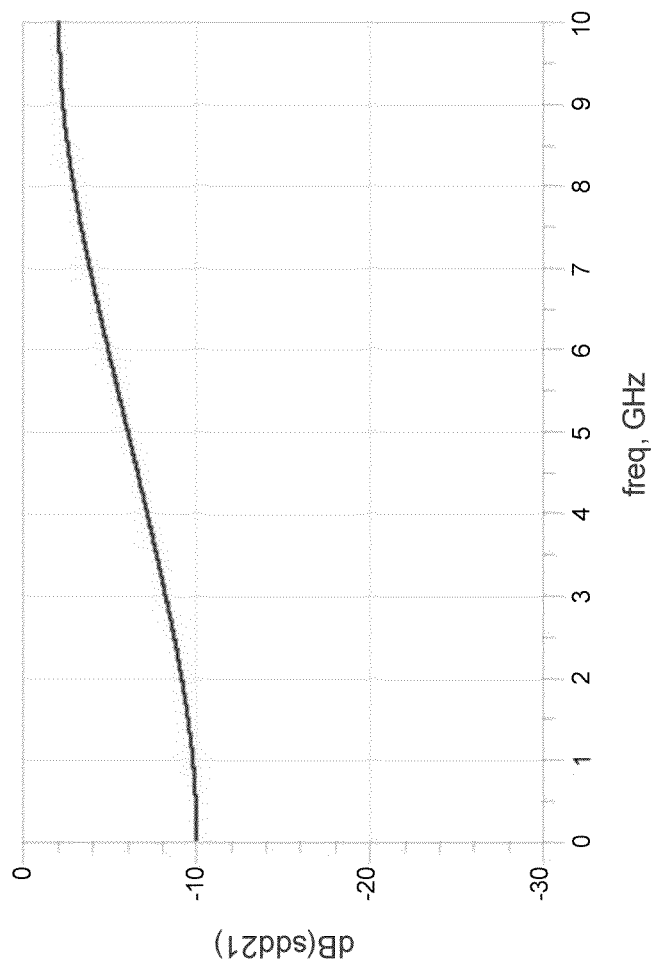
FIG. 6 is a diagram showing the relation between loss and frequency of a high-pass circuit with DC loss.

It is to be noted that the equalizer of the present invention is not limited to the aforementioned parallel RC circuits 106, 107 or the aforementioned series resistor-inductor circuit 109. FIG. 6 is a diagram showing the relation between loss and frequency of a high-pass circuit with DC loss. All the embodiments of the high-pass circuit with DC loss shall be considered to be within the scope of the equalizer of the present invention, and the range of DC loss varies depending on the mode of the digital electronic device. In the present invention, there may be more than one layer of differential-mode reference metal portion. When a plurality of layers of differential-mode reference metal portion are implemented, each of the plurality of layers of differential-mode reference metal portion is provided with a pair of differential signal lines thereon. The pair of differential signal lines disposed on each of the plurality of layers of differential-mode reference metal portion are electrically connected in series by a via-post, achieving the same effect as the pair of differential signal lines 103, 104 of the aforementioned embodiments. In the present invention, the phrase "disposed on . . . " means "disposed above . . . ".

Figure 7:
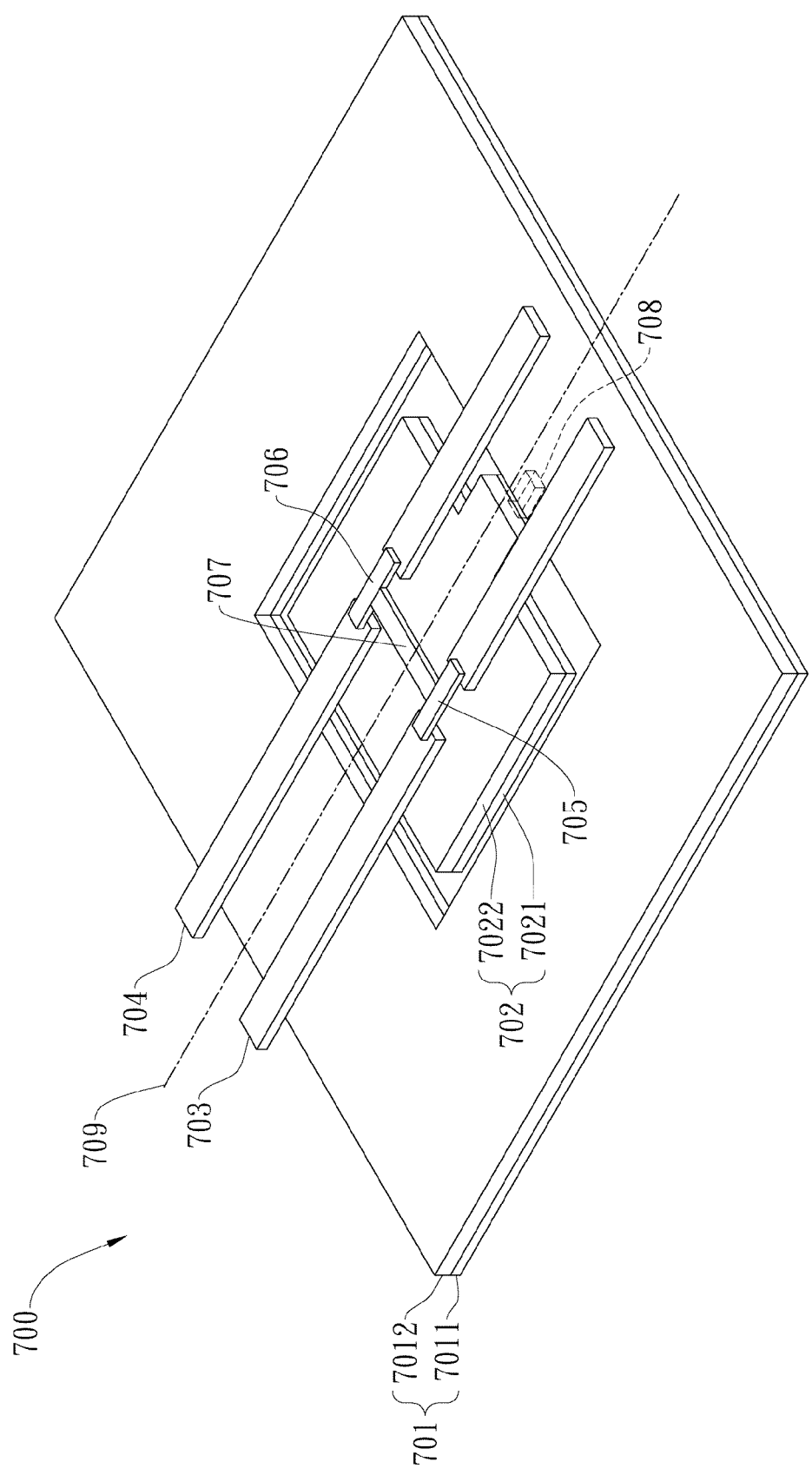
FIG. 7 is a perspective view of a digital electronic device in accordance with another embodiment of the present invention.
Figure 8:
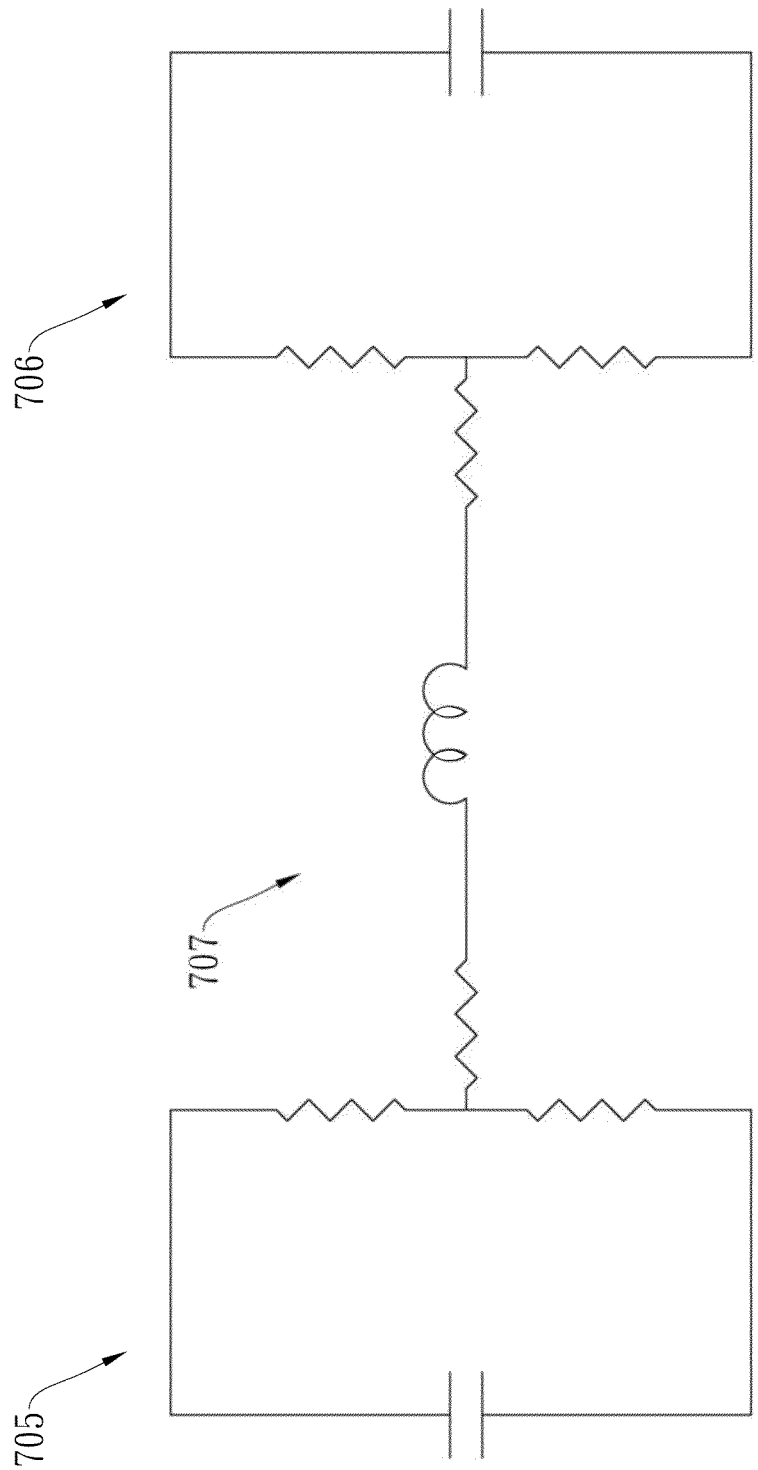
FIG. 8 is a circuit diagram of the equalizers shown in FIG. 7.

FIG. 7 is a perspective view of a digital electronic device in accordance with another embodiment of the present invention. The digital electronic device 700 comprises a grounded metal portion 701, a layer of differential-mode reference metal portion 702, a pair of differential signal lines 703, 704 and equalizers 705, 706, 707. The equalizers 705, 706 are two parallel RC circuits while the equalizer 707 is a series resistor-inductor circuit. The two parallel RC circuits 705, 706 are embedded respectively in the pair of differential signal lines 703, 704 and bridged by the series resistor-inductor circuit 707, as shown in FIG. 8. The grounded metal portion 701 comprises a first metal plate 7011 electrically connected to ground and a first substrate 7012 disposed on the first metal plate 7011. The layer of differential-mode reference metal portion 702 comprises a second metal plate 7021 and a second substrate 7022 disposed on the second metal plate 7021. The layer of differential-mode reference metal portion 702 is coplanar with the grounded metal portion 701, and the first metal plate 7011 and the second metal plate 7021 are separated from each other. The second metal plate 7021 is electrically connected to the first metal plate 7011 by a conductive structure 708 having a resistor so that the digital electronic device 700 has a further enhanced capability of suppressing direct current or low frequency noise of the common-mode noise. The pair of differential signal lines 703, 704 are disposed on the second substrate 7022 and arranged symmetrically with respect to a centerline 709 of the second metal plate 7021. Further, part of the pair of differential signal lines 703, 704 is disposed on and electromagnetically coupled to the grounded metal portion 701. The digital electronic device 700, like the digital electronic devices of the aforementioned embodiments, is capable of effectively suppressing common-mode noise and improving eye diagram.

The scope and spirit of the present invention are not limited to the aforementioned embodiments. Moreover, it will be understood that the drawings are merely schematic representations of the invention and not illustrated according to actual scale, and some of the components may be magnified or simplified for purposes of pictorial clarity. The embodiments depicted above and the appended drawings are descriptive and are not intended to limit the scope of the present invention. The scope of the present invention is defined by the appended claims.

What is claimed is:

1. A digital electronic device comprising:
   a grounded metal portion comprising a first metal plate electrically connected to ground and a first substrate disposed on the first metal plate;
   a layer of differential-mode reference metal portion comprising a second substrate and a second metal plate electrically connected to the first metal plate by at least a conductive structure
   a pair of differential signal lines, at least one portion thereof being disposed on the second substrate of the layer of differential-mode reference metal portion, the pair of differential signal lines being electromagnetically coupled to the second metal plate of the layer of differential-mode reference metal portion; and
   an equalizer electrically connected to the pair of differential signal lines,
   wherein the digital electronic device is configured to suppress common-mode noises;
   wherein the layer of differential-mode reference metal portion is coplanar with the grounded metal portion and the first metal plate and the second metal plate are separated from each other; and
   wherein the at least one conductive structure has a resistor configured to suppress direct current or low frequency common-mode noise.

2. The digital electronic device according to claim 1, wherein the equalizer is electromagnetically coupled to the second metal plate of the layer of differential-mode reference metal portion.

3. The digital electronic device according to claim 1, wherein the pair of differential signal lines are disposed symmetrically with respect to a centerline of the second metal plate.

4. The digital electronic device according to claim 1, wherein the equalizer is a high-pass circuit with DC loss.

5. The digital electronic device according to claim 1, wherein the equalizer is composed of two parallel RC circuits embedded respectively in the pair of differential signal lines.

6. The digital electronic device according to claim 1, wherein the equalizer is a series resistor-inductor circuit bridging the pair of differential signal lines.

7. The digital electronic device according to claim 1, wherein the equalizer bridges the pair of differential signal lines and comprises a resistor and a transmission line arranged in series connection.

8. The digital electronic device according to claim 1, wherein the equalizer is composed of two parallel RC circuits and a series resistor-inductor circuit, and wherein the two parallel RC circuits are embedded respectively in the pair of differential signal lines and bridged by the series resistor-inductor circuit.

9. The digital electronic device according to claim 1, wherein the equalizer is disposed symmetrically with respect to a centerline between the pair of differential signal lines.

* * * * *